(12) United States Patent
Nakano

(10) Patent No.: US 6,600,585 B1
(45) Date of Patent: Jul. 29, 2003

(54) OPTICAL TRANSMITTER

(75) Inventor: Masayuki Nakano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/375,381

(22) Filed: Aug. 17, 1999

(30) Foreign Application Priority Data

Aug. 19, 1998 (JP) .......................................... 10-232469

(51) Int. Cl.[7] .............................................. H04B 10/04
(52) U.S. Cl. ........................ 359/180; 359/110; 359/188
(58) Field of Search ................................ 359/180, 188, 359/110; 324/537

(56) References Cited

U.S. PATENT DOCUMENTS

| 4,240,032 A | * | 12/1980 | Johnson et al. ............. 324/761 |
| 5,214,525 A | * | 5/1993 | Gershman et al. .......... 359/180 |
| 5,381,103 A | * | 1/1995 | Edmond et al. ............ 324/753 |
| 5,444,390 A | * | 8/1995 | Bartlett et al. ............. 324/770 |

FOREIGN PATENT DOCUMENTS

| EP | 0981214 A2 | * | 2/2000 |
| JP | 4-321288 | | 11/1992 |
| JP | 10-160785 | | 6/1998 |

* cited by examiner

Primary Examiner—Thomas Mullen
(74) Attorney, Agent, or Firm—McGinn & Gibb, PLLC

(57) ABSTRACT

An optical transmitter includes a light-emitting diode, a drive circuit for outputting a light signal while driving the light-emitting diode which is connected between two electrodes of an anode and a cathode of the light-emitting diode, a voltage applying terminal for a light-emitting diode which is arranged on a package on which the light-emitting diode and the drive circuit are mounted, for applying a voltage to one electrode of the light-emitting diode, and a current supplying terminal for screening a light-emitting diode and arranged on the package for applying a current to the other electrode of the light-emitting diode at a time of screening the light-emitting diode.

20 Claims, 7 Drawing Sheets

OPTICAL TRANSMITTER

BACKGROUND OF THE INVENTION

The present invention relates to an optical transmitter, for instance, used for communication using an optical fiber. More particularly, the invention relates to an optical transmitter for implementing a screening test of a light-emitting diode.

DESCRIPTION OF THE PRIOR ART

A light-emitting diode is generally used in various kinds of electronic equipment including an optical transmitter causing a light signal to be incident into an optical fiber. In particular, the reliability of the light-emitting diode used for the optical transmitter is important.

In general, a semiconductor element such as a light-emitting diode and so forth initially incorporates inferior goods with prescribed probability. Thus, such inferior goods are removed in the process of the selection (screening) after manufacturing. In this screening process, the elements to be screened are mounted on a heat sink and so forth, or are assembled in a module. The screening process causes the element to be screened under conditions more severe than those of normal use. Large and small changes in the characteristics of the element are checked before and after screening under the severe conditions. When the change in the characteristics is larger than the prescribed change, the element is removed as inferior goods.

Now, in general, when the process causes a light-emitting diode to be selected before being arranged on an optical transmitter, the light-emitting diode is selected as being a single element. In order to select the light-emitting diode as being the single element, for instance, as shown in the Japanese Patent Application Laid-Open No. HEI 10-160785 which discloses a technique about selection of a semiconductor laser, it is not necessary to measure current-light output characteristics. It may be accomplished by measuring other characteristics such as current-voltage characteristics of the light-emitting diode.

However, in such a method, even though the inferior goods are removed from the light-emitting diode after manufacture, if the process causes the light-emitting diode to be damaged in the assembling stage to the optical transmitter, the inferior goods are mixed with the optical transmitter as being finished goods. Consequently, it is necessary to implement the selection two times, thus the cost becomes high because of the selection process. The technique disclosed in the Japanese Patent Application Laid-Open No. HEI 4-321288 implements the selection of the element under the condition that the drive circuit is connected to the element similar to the semiconductor laser drive circuit. However, in the case of the optical transmitter, such a selection is incapable of being implemented. As is described hereinafter.

FIG. 1 shows a conventional device for selection of the light-emitting diode. The light-emitting diode 12 and the light-emitting diode drive integrated circuit (LD drive LSI) 13 for driving thereof are arranged in the optical transmitter 11. The optical transmitter 11 is provided with two terminals of a power supply terminal for light-emitting diode 14 and a power supply terminal for drive circuit 15. When the process implements selection of the light-emitting diode 12, it is capable of discriminating a change of the characteristic in a short time because the process causes the light-emitting diode to be driven under high temperature. For that reason, the process of the screening is implemented with the condition that the optical transmitter 11 is contained in the isothermal vessel 17. The isothermal vessel 17 is maintained with prescribed temperature while this manufacturing process is implemented by the control circuit 18. Further, the control circuit 18 applies prescribed voltage both to the power supply terminal for light-emitting diode 14 and the power supply terminal for drive circuit 15 from the constant-voltage source 19 while the present manufacturing process is implemented, thus the control is implemented such that the prescribed current 21 flows into the light-emitting diode 12.

In the optical transmitter 11 shown in FIG. 1, the current 21 which flows at the time of the manufacturing process of selection to the light-emitting diode 12 is larger than the ordinary value. However, the present current value is remarkably larger than the current value which the LD drive LSI 13 is capable of driving the light-emitting diode 12. Consequently, it is incapable of implementing the selection of the light-emitting diode 12 while using the LD drive LSI 13 after the LD drive LSI 13 and the light-emitting diode 12 are mixed to be mounted. Of course, it is not economical that the optical transmitter is produced while using together the LD drive LSI 13 capable of driving the light emitting diode 12 with large current and the light-emitting diode 12.

SUMMARY OF THE INVENTION

In view of the foregoing, it is an object of the present invention in order to overcome the above-mentioned problems, to provide an optical transmitter which mounts the light-emitting diode and the driving circuit for driving thereof at regular time in mixed condition, and which is capable of selecting the light-emitting diode.

According to a first aspect of the present invention, for achieving the above-mentioned object, there is provided an optical transmitter which includes a light-emitting diode, a drive circuit for outputting a light signal while driving the light-emitting diode which is connected between two electrodes of an anode and a cathode of the light-emitting diode, a voltage applying terminal for light-emitting diode which is arranged on a package on which these light-emitting diode and the drive circuit are mounted, for applying voltage to one electrode of the light-emitting diode, and a current supplying terminal for light-emitting diode selection which is arranged at the package for applying current at the time of screening of the light-emitting diode to the other electrode of the light-emitting diode.

According to a second aspect of the present invention, there is provided an optical transmitter which includes, a light-emitting diode, a drive circuit for outputting a light signal while driving the light-emitting diode which is connected between two electrodes of an anode and a cathode of the light-emitting diode, a voltage applying terminal for light-emitting diode which is arranged on a package on which these light-emitting diode and the drive circuit are mounted, for applying voltage to one electrode of the light-emitting diode, a current supplying terminal for light-emitting diode selection which is arranged at the package for applying current at the time of screening of the light-emitting diode to the other electrode of the light-emitting diode, and a switch for turning ON/OFF electrically between the current supplying terminal for light-emitting diode and another electrode of the light-emitting diode.

According to a third aspect of the present invention, in the first aspect or the second aspect, there is provided an optical transmitter, wherein the current applying terminal for light-emitting diode selection is arranged at rear surface part of the package so as not to protrude to side surface part.

According to a fourth aspect of the present invention, in the first aspect or the second aspect, there is provided an optical transmitter, wherein the one electrode is a cathode, while the other electrode is anode.

According to a fifth aspect of the present invention, in the first aspect or the second aspect, there is provided an optical transmitter, wherein prescribed current which is more than ordinary use is supplied from constant current source with the condition that the package is heated to prescribed temperature in isothermal vessel to the current applying terminal for light emitting diode selection.

According to a sixth aspect of the present invention, in the first aspect or the second aspect, there is provided an optical transmitter, which further includes a constant-current source connected to the current applying terminal for light-emitting diode selection for supplying prescribed current which is more than ordinary use from constant current source with the condition that the package is heated to prescribed temperature in isothermal vessel for the sake of light emitting diode selection, and the control circuit executes temperature control of the isothermal vessel, current control of the constant current source, and an application control of constant-voltage to the voltage application terminal for light-emitting diode.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

The present disclosure relates to Japanese Patent Application No. 10-232469 filed Aug. 19, 1998, and which is expressly incorporated herein by reference in its entirety.

DETAILED DESCRIPTION OF THE PREFERRED EMBODIMENT

A preferred embodiment of the present invention will be described in detail in accordance with the accompanying drawings.

First Embodiment

Figure 1:
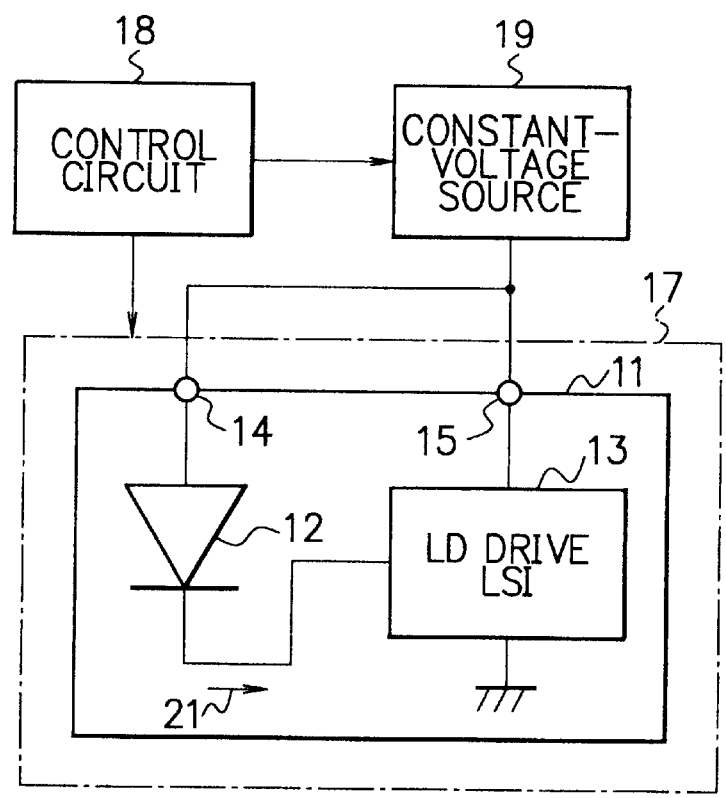
FIG. 1 is a schematic view showing an outline of conventional device constitution for the sake of selection of the light-emitting diode.
Figure 2:
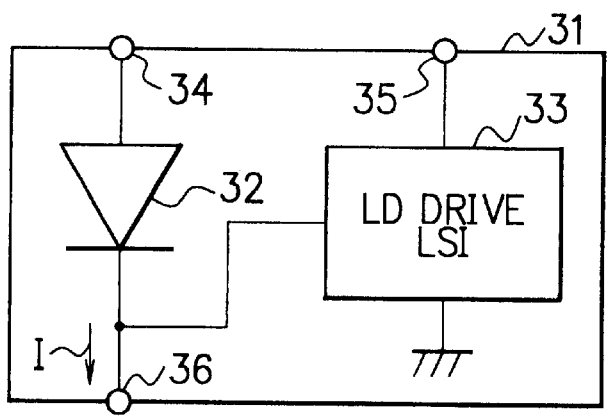
FIG. 2 is a circuit diagram of the optical transmitter in a first embodiment of the present invention.

FIG. 2 shows a diagram of an optical transmitter in a first embodiment of the present invention. The optical transmitter 31 of the present embodiment includes a light-emitting diode driving integrated circuit (LD DRIVE LSI) 33 and a light-emitting diode 32. A terminal for constant-current regulated power supply 36 is provided except for two terminals of a power supply terminal for light-emitting diode 34 and a power supply terminal for driving circuit in a package of the optical transmitter 31.

Figure 3:
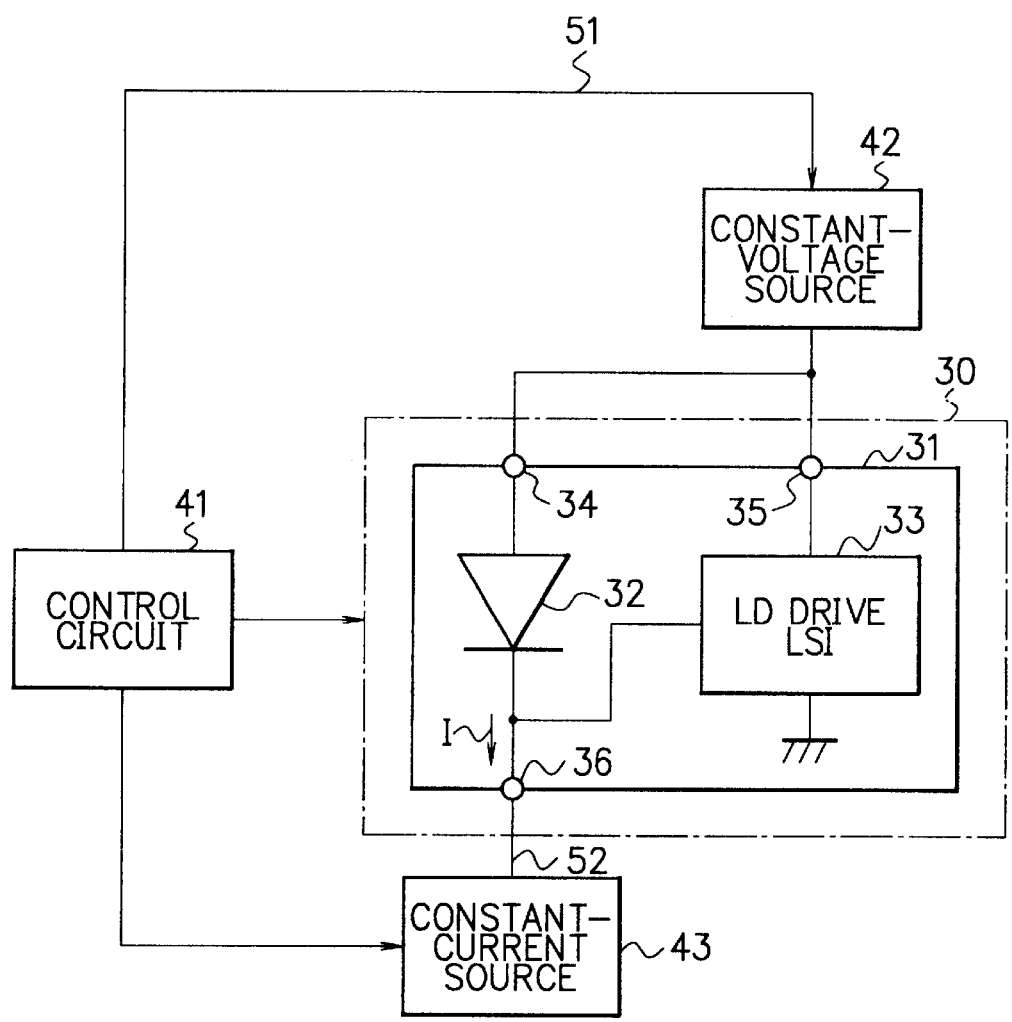
FIG. 3 is a schematic view showing the device in the case where it selects the light-emitting diode using the optical transmitter of the first embodiment.

FIG. 3 shows a diagram of the device in the case where the optical transmitter implements selection (screening) of the light-emitting diode while using the optical transmitter of the present embodiment. The optical transmitter 31 shown in FIG. 2 is accommodated in an isothermal vessel 30 in order to place it in relatively high temperature environment. The temperature Ta of the isothermal vessel 30 is controlled by a control circuit 41. The control circuit 41 is provided with a computer in which CPU (Central Processing Unit) (which is not illustrated) is loaded, thus implementing temperature control of the isothermal vessel 30, and implementing the whole control for the sake of selection of the light emitting diode. For that reason, the control circuit 41 is connected to a constant-voltage power supply 42 and a constant-current source 43. The constant-voltage power supply 42 is connected to the power supply terminal for light emitting diode 34 and the power supply terminal for driving circuit 35 to apply a driving voltage V thereto. Further, the constant-current source 43 is connected to a terminal for constant-current source 36 to which a driving current I is supplied.

Figure 4:
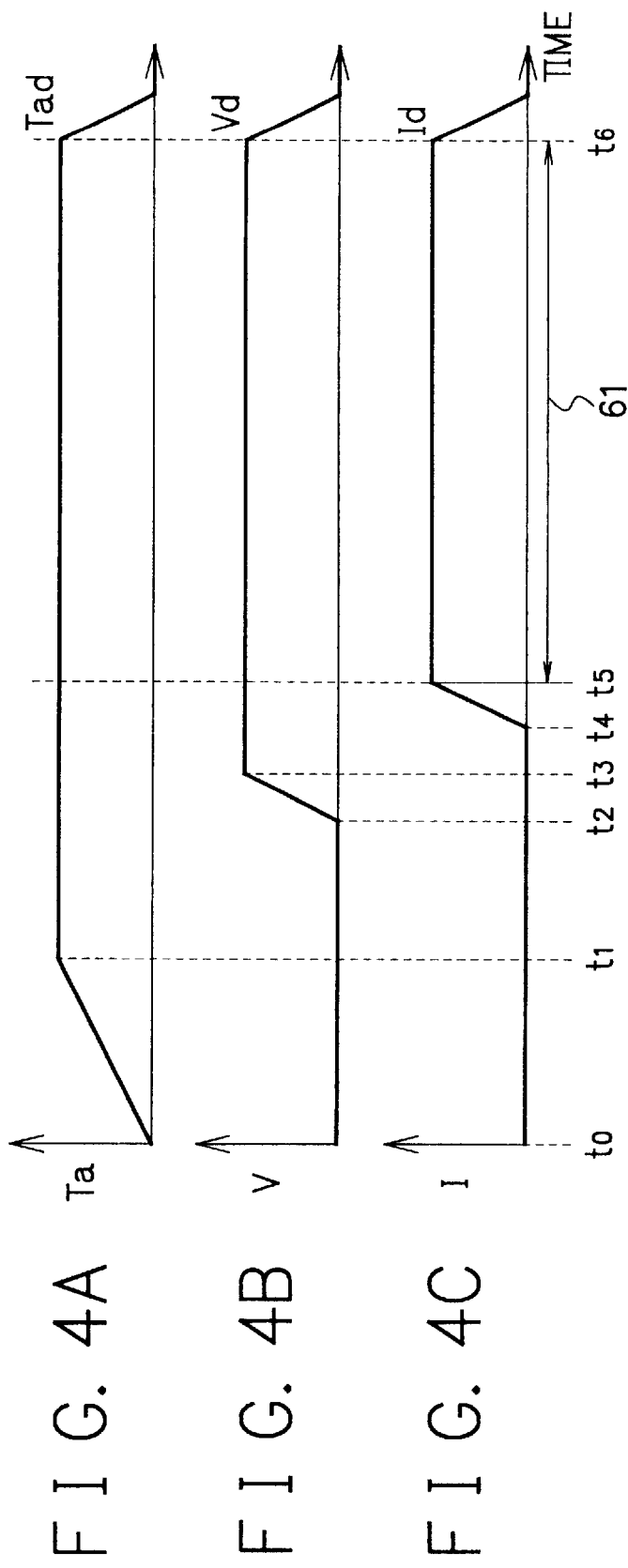
FIG. 4 is an explanatory view showing control content of a control circuit at the time of selection work of the light emitting diode in the first embodiment.

FIGS. 4A to 4C show control content of the control circuit at the time of the selection work of the light emitting diode. FIG. 4A shows change of the temperature Ta of the isothermal vessel 30. FIG. 4B shows change of the driving voltage V according to the constant-voltage power supply 42. Further, FIG. 4C shows change of the driving current I. In these drawings the time $t_0$ is a starting time of selection work of the light emitting diode, consequently, heating of the isothermal vessel 30 is started. The isothermal vessel 30 is maintained with fixed screening temperature Tad during from the time $t_1$ when the isothermal vessel reaches prescribed temperature until the time $t_6$ when heat control for selecting the light-emitting diode is terminated.

The control circuit 41 controls the isothermal vessel 30 with screening temperature Tad. The control circuit 41 transmits a constant-voltage driving start control signal 51 with regard to the constant-voltage power supply 42 at the time $t_2$ when prescribed time is elapsed for the reason that the optical transmitter 31 accommodated in the isothermal vessel 30 is maintained with the screening temperature Tad. For that reason, the constant-voltage power supply 42 is firstly driven, thus applying driving voltage $V_d$ as the prescribed constant-voltage to the power supply terminal for light emitting diode 34 and the power supply terminal for driving circuit 35 from the time $t_3$.

The control circuit 41 transmits a constant-current drive start control signal 52 to the constant-current source 43 at the time $t_4$ when prescribed sufficient time for applying the driving voltage V by the constant-voltage power supply 42 is elapsed to start the drive. For that reason, the constant-current source 43 rises to supply the driving current Id to the terminal for constant-current source 36 as a required constant-current from the time $t_5$. Period during from the time $t_5$ to the time $t_6$ when the heat control for the selection of the light-emitting diode is terminated is called as light-emitting diode screening period 61.

In the light-emitting diode screening period 61, the driving voltage $V_d$ is applied to the anode side of the light-emitting diode 32 with the condition that the optical transmitter is maintained in the screening temperature Tad. Then, in this condition, the driving current $I_d$ flows between an anode and a cathode, thus the light-emitting diode 32 emits light. At this time, the driving voltage $V_d$ is applied to a light-emitting diode driving integrated circuit 33 through the power supply terminal for driving circuit 35. However, it is not necessary that the light-emitting diode 32 is driven by the driving voltage $V_d$.

Figure 5:
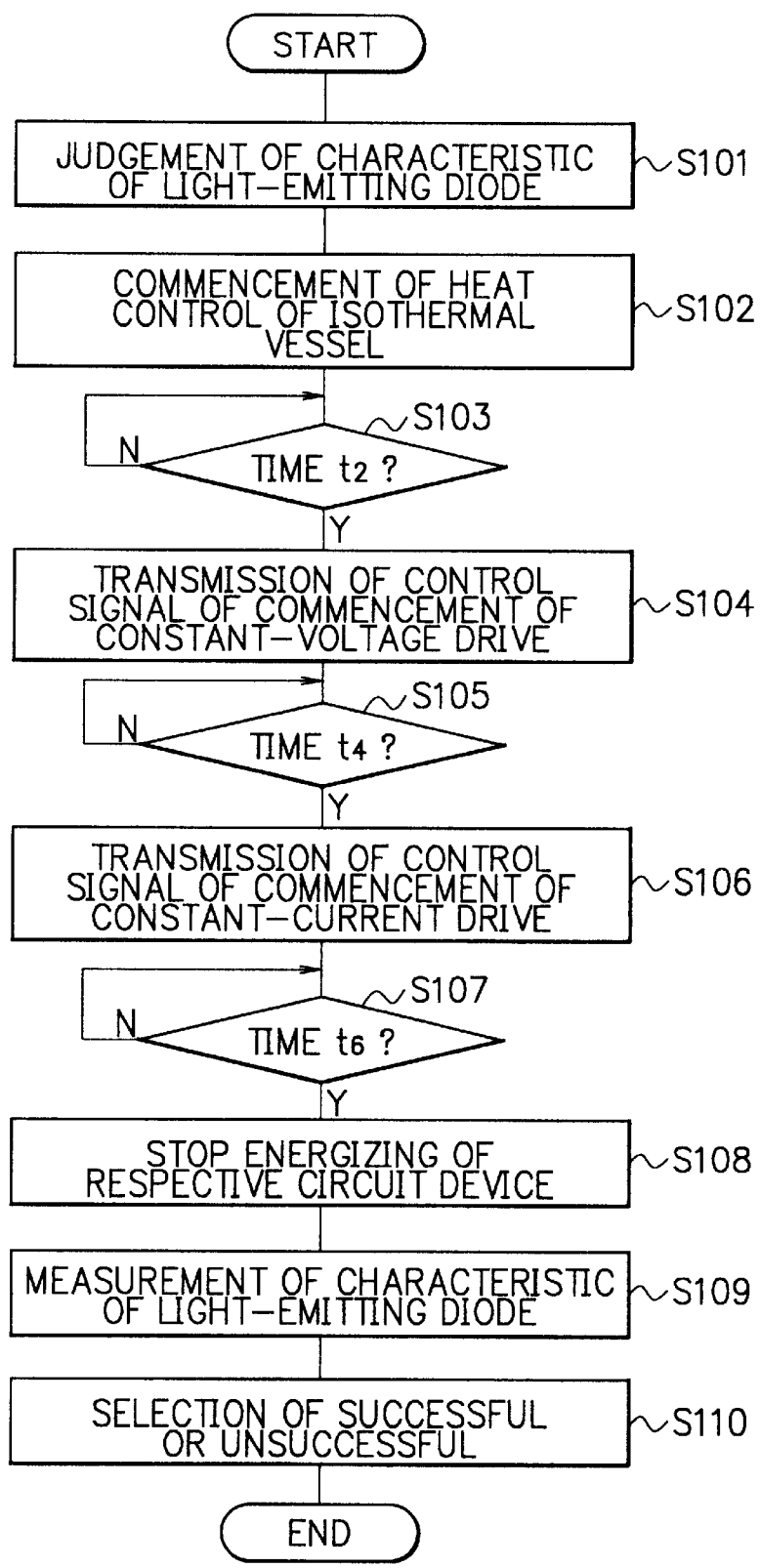
FIG. 5 is a flowchart showing main control points of the CPU in the first embodiment.

FIG. 5 shows principal part of control of the CPU in the present embodiment. The above-described computer stores the program for the sake of control in the storage medium such as a magnetic disk or a ROM (Read Only Memory) and so forth (which are not illustrated), the control for the sake of selection of the light emitting diode is implemented due to the fact that the CPU executes the program.

The CPU applies the prescribed voltage to two terminals of the power supply terminal for light-emitting diode 34 and the power supply terminal for driving circuit 35 before the stage of setting the optical transmitter 31 to the isothermal vessel 30 or after the stage of setting the optical transmitter to the isothermal vessel 30, before in order to increase the temperature. And then, the CPU causes the light-emitting diode driving integrated circuit 33 to be driven under ordinary environment to measure a characteristic of the light emitting diode 32 (STEP S101). Next, the CPU commences the heat control of the isothermal vessel 30 from the commencement time $t_o$ of the control for the sake of selection of the light-emitting diode 32 (STEP S102).

The control circuit 41 is provided with counter on the inside thereof for counting clock signal. The control circuit 41 counts timing until arrival of the times $t_2$, $t_4$, and $t_6$ after $t_1$ using this count value. However, it is also suitable that the control circuit 41 detects the time $t_1$ when the isothermal vessel 30 arrives to the prescribed temperature by a sensor not illustrated, further, the control circuit 41 implements establishment of the time $t_2$ from the time point when the control circuit 41 detects that the temperature of the optical transmitter 31 becomes constant, according to the control circuit 41. In the case of the present embodiment, since the control is performed with only timer circuit using the counter, time until termination of the screening becomes somewhat long, however, there is the advantage that control is simplified.

When the CPU discriminates that the time $t_2$ arrives while monitoring the count value (STEP S103: Y), the CPU transmits the constant-voltage drive commencement control signal 51 to the constant-voltage source 42 (STEP S104). For that reason, the drive of the constant-voltage source 42 is commenced. Further, when the CPU discriminates that the time $t_4$ arrives while monitoring the count value (STEP S105: Y), the CPU transmits the constant-current drive commencement control signal 52 to the constant-current source 43 to begin the drive (STEP S106). Furthermore, when the CPU also discriminates that the time $t_6$ arrives while monitoring the count value (STEP S107: Y), the CPU stops current-carrying of the isothermal vessel 30, and stopping drive of the constant-voltage source 42 and the constant-current source 43 (STEP S108).

When the optical transmitter 31 is to sufficient low temperature. The CPU applies the prescribed voltage to the two terminals of the power supply terminal for light-emitting diode 34 and the power supply terminal for driving circuit 35. Then, the CPU causes the light-emitting diode drive integrated circuit 33 to be driven under the ordinary environment to measure the characteristic (STEP S109). Then, the selection is implemented whether the light-emitting diode 32 of the optical transmitter 31 is of success in an examination while comparing the obtained measured value with the measured value obtained previously in STEP S101 (STEP S110). The selection standard of the light-emitting diode 32 is not related directly to the present invention, therefore, the description thereof is omitted.

Second Embodiment

Figure 6:
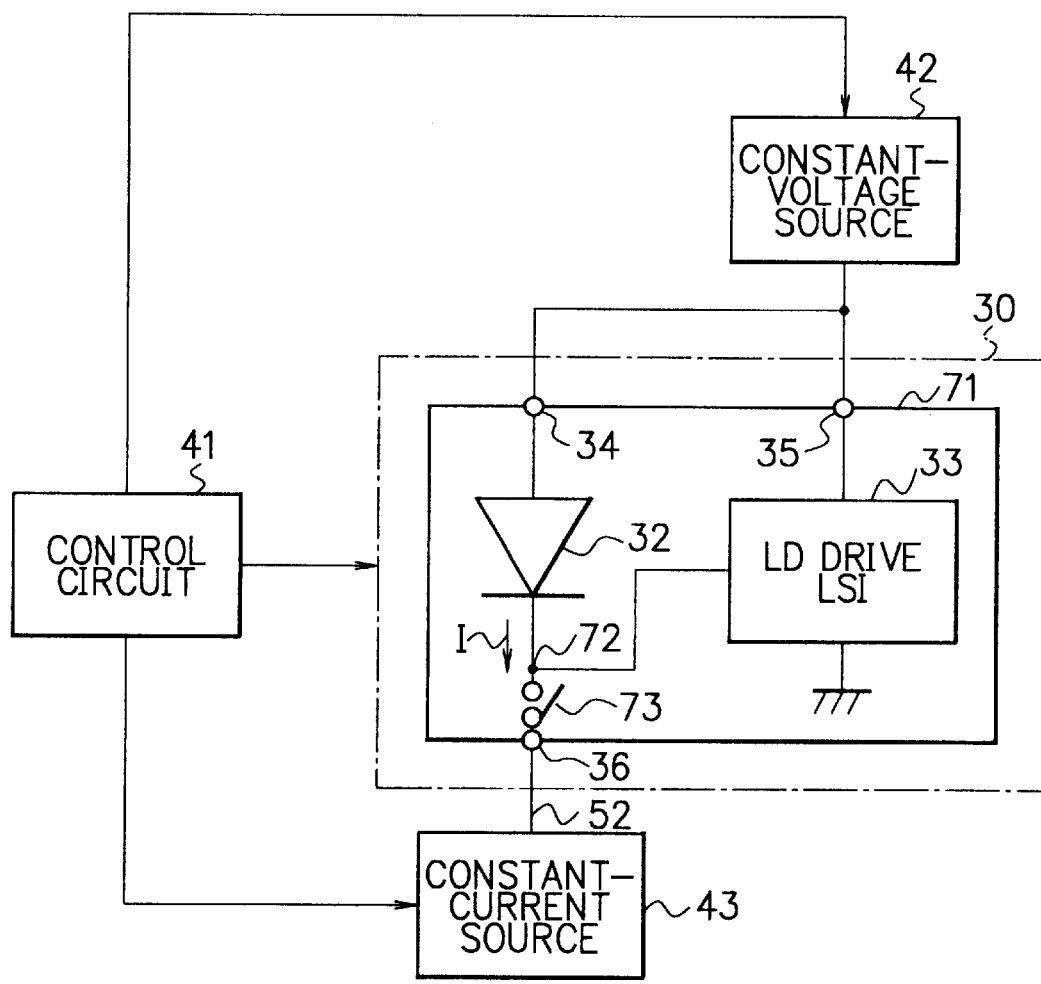
FIG. 6 is a schematic view showing the condition in which the optical transmitter in a second embodiment of the present invention is set to the device for the sake of selection thereof.

FIG. 6 shows the condition that the optical transmitter in the second embodiment of the present invention is set to the device for the sake of selection. The same mark is added to the same part as that of FIG. 3 of the first embodiment to omit description about this matter.

The optical transmitter 71 of the second embodiment cuts between connection portion 72 of a cathode of the light-emitting diode 32 and the drive terminal of the light-emitting diode drive integrated circuit 33, and the terminal for constant-current source 36 to connect a switch 73 therebetween. The switch 73 has a mechanical contact such as a DIP switch. The operator is capable of being turned ON/OFF the DIP switches. Of course, it is also suitable that there is provided a new terminal for the sake of switch control according to an optical transmitter, and a switch drive circuit. The switch drive circuit causes a switch opening or closing control signal turning ON the switch to be supplied to the former terminal from the control circuit 41 during the light-emitting diode screening period 61 (referring to FIG. 4). In this case, the power source is supplied also to the switch drive circuit from the constant-voltage source 42.

The optical transmitter 71 of the second embodiment turns the switch 73 ON during from the time point when accommodating the optical transmitter 71 to the isothermal vessel 30 to at least the light-emitting diode screening period 61 to cause the connection section 72 and the terminal for constant-current source 36 to be conductive. The work of this condition is the same as that of the above first embodiment. After termination of the selection of the light-emitting diode 32, the switch 73 turns OFF to cause the connection portion 72 and the terminal for constant-current source 36 to be non-conductive. For that reason, the terminal for constant-current source 36 of the optical transmitter 71 is cut completely from the internal circuit with ordinary condition of the use. Consequently, even though there occurs the condition that voltage is applied incorrectly to the terminal for constant-current source 36 further the terminal for constant-current source 36 is grounded, there does not occur something wrong that the optical transmitter 71 itself is damaged and so forth. Consequently, it is capable of being improved the optical transmitter 71 in connection with safety or reliability.

Third Embodiment

Figure 7:
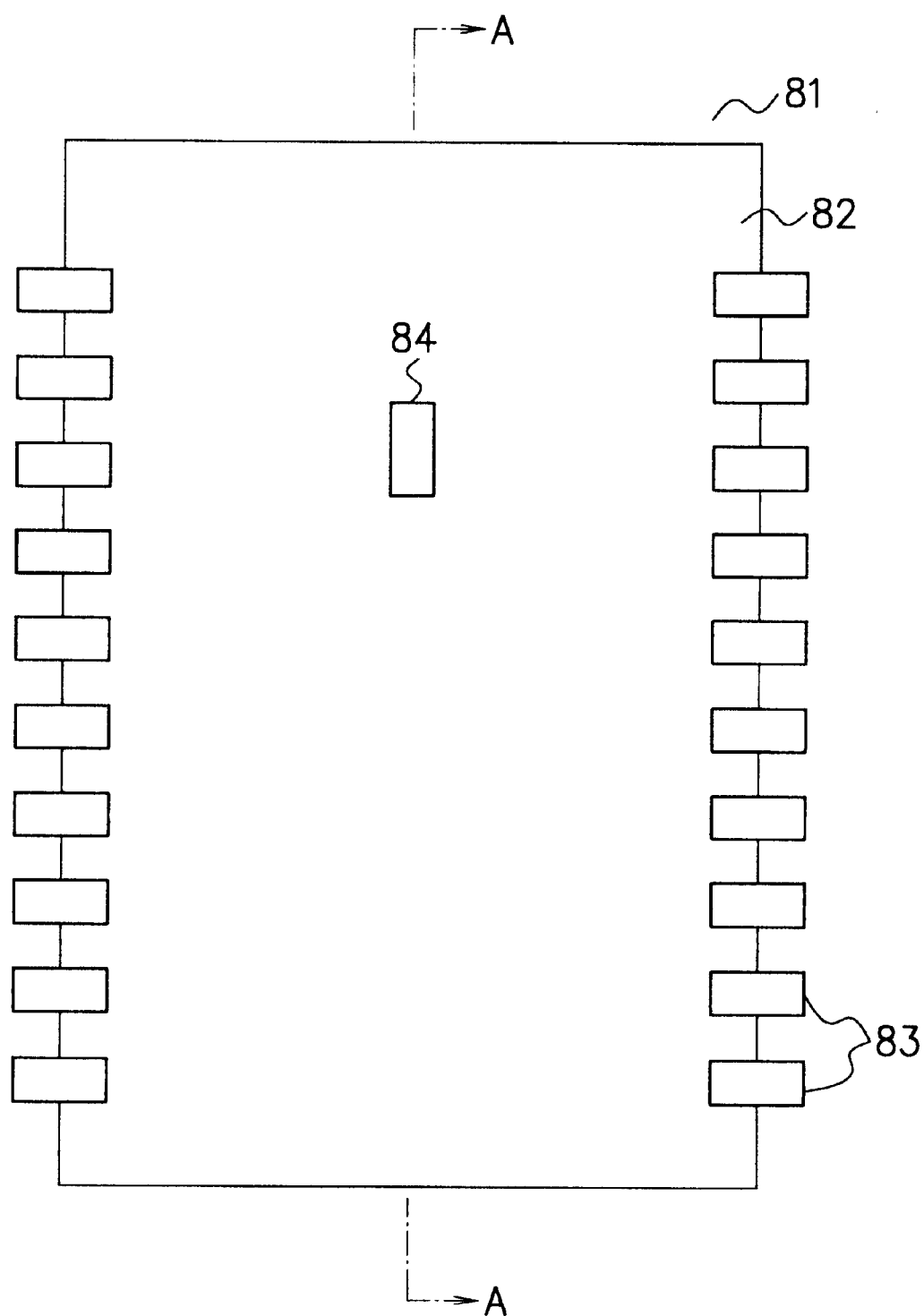
FIG. 7 is a rear elevation of the optical transmitter in a third embodiment of the present invention.

FIG. 7 shows the rear of the optical transmitter in a third embodiment of the present invention. The optical transmitter 81 of the present embodiment protrudes a plurality of terminals 83 from right and left of base part of the package body 82. The terminal for constant-current source 84 is arranged at about center part of the base part of the package body 82 as a pad provided for the rear.

Figure 8:
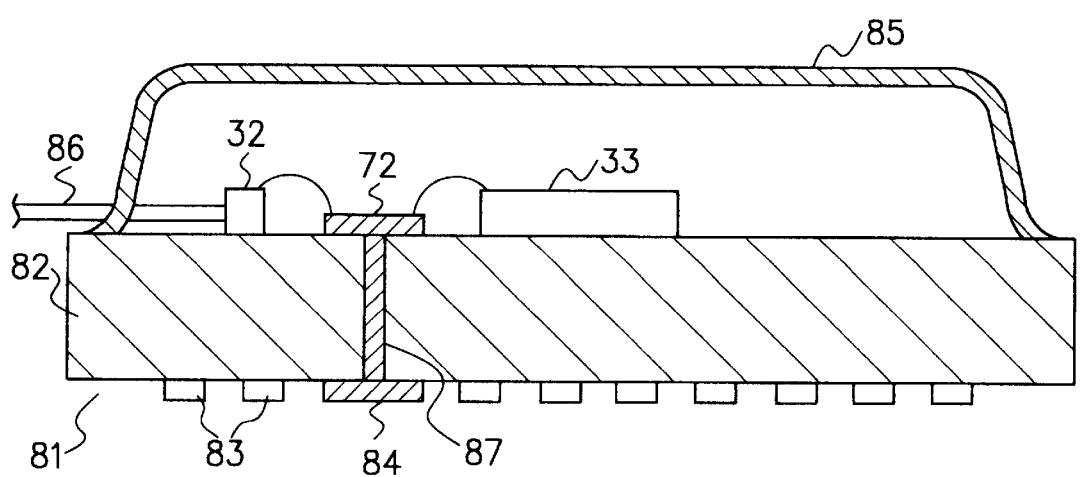
FIG. 8 is a sectional view showing a condition that the optical transmitter is cut off in the direction of A—A of FIG. 7.

FIG. 8 is a sectional view showing a condition of cutting the optical transmitter in the direction of A—A of FIG. 7. The same mark is appended to the same part as that of FIGS. 3, and 6, in FIG. 8, thus description thereof is omitted. The optical transmitter 81 causes the light-emitting diode 32 and the light-emitting diode drive integrated circuit 33 to be mixed therein to be mounted on the substrate which constitutes the package body 82. The package body 82 is sealed by a cover 85. An optical fiber 86 is connected in optical method to the light-emitting diode 32, thus light signal is sent to the external part through the optical fiber 86. The connection portion 72 between the cathode of the light-emitting diode 32 and the drive terminal of the light-emitting drive integrated circuit 33 is connected electrically to the terminal for constant-current source 84 through the through-hole.

In such the constitution of the optical transmitter 81, the terminal for constant-current source 84 is connected to the constant-current source 43 shown in FIG. 3 in the manufacturing process in which the selection of the light-emitting diode 32 is implemented. For this connection, it is suitable that a terminal for connecting it to the terminal for constant-current source arranged at the prescribed position to which the optical transmitter 81 in the isothermal vessel 30 described for instance, in the first embodiment. The optical transmitter 81 accepted by the selection of the light-emitting diode 32 is fixed to the prescribed position of the another substrate and so forth about the rear side. For that reason, the terminal for constant-current source 84 hides itself to the position where the operator or electrical parts can not be touched easily thereto. Thus it is capable of being secured safety and reliability of the optical transmitter 81.

Further, in the first embodiment of the present invention, the terminal corresponding to the terminal for constant-current source 84 in the third embodiment is realized as the terminal 83 in the second embodiment. Consequently, there is dangerousness that the operator or the electrical parts is touched to the terminal for constant-current source 84. In order to reduce such dangerousness, it is effect to cause the terminal concerned to be cut, or to cause the terminal to be covered by insulation tube or the like.

Furthermore, in the embodiment constant voltage is applied to the cathode side of the light-emitting diode, however, it is capable of applying the present invention to the light-emitting diode so as to apply constant-voltage to the anode side to the contrary. Moreover, in the embodiment, only the light-emitting diode and the light-emitting diode drive integrated circuit are mounted on the package, however, it is capable of applying the present invention to the case where the circuit except for this case further mounted.

As described above, according to the present invention, the first aspect causes the terminal corresponding to both electrodes of the light-emitting diode to be arranged to the package so as to enable light-emitting diode mounted on the package as the optical transmitter to be conducted to control it independently. For that reason, it is capable of driving the light-emitting diode, even though the drive circuit of the package is not operated.

Further, according to the present invention, the second aspect causes the effect which is the same as that of the first aspect to be obtained. Specifically, there is provided the switch for turning ON/OFF electrically between the current supply terminal for the sake of selection of the light-emitting diode and the electrode of the light-emitting diode. Therefore, regardless of a situation causing the package to be arranged to the equipment, the undesirable effect that the terminal is contacted to the another parts electrically after termination of the screening of the light-emitting diode is prevented. Thus, the reliability of the optical transmitter is enhanced.

Furthermore, according to the third aspect of the present invention, the same effect as that of the first and the second aspect of the invention can be obtained. As the another effect, the current supply terminal for the sake of selection of the light-emitting diode is arranged at a position at the rear part of the package and the terminal is not protruded to a side part. Therefore, the undesirable effect that the terminal is not contacted to another parts and so forth electrically after arranging the package to the another material is prevented. Thus, the reliability of the optical transmitter is improved. It is unnecessary to use the switches, therefore, there is the effect to suppress price of the apparatus.

While preferred embodiments of the invention have been described using specific terms, the description has been for illustrative purpose only, and it is to be understood that changes and variations may be made without departing from the spirit or scope of the following claims.

What is claimed is:

1. An optical transmitter comprising:
   a light-emitting diode;
   a drive circuit for outputting a light signal while driving said light-emitting diode which is connected between two electrodes of an anode and a cathode of said light-emitting a voltage applying terminal for light-emitting diode which is arranged on a package on which said light-emitting diode and said drive circuit are mounted, for applying voltage to one electrode of said light-emitting diode; and
   a current supplying terminal for screening said light-emitting diode arranged at said package for applying current at a time of screening of said light-emitting diode to the other electrode of said light-emitting diode.

2. An optical transmitter as claimed in claim 1, wherein said current supplying terminal is arranged at a first surface part of said package at a substantially center portion so as not to protrude to a second surface part.

3. An optical transmitter as claimed in claim 1, wherein said one electrode is a cathode, while the other electrode is an anode.

4. An optical transmitter as claimed in claim 1, wherein a prescribed current is supplied from a constant current source to said current supplying terminal such that said package is heated to a prescribed temperature in an isothermal vessel.

5. An optical transmitter as claimed in claim 1, further comprising:
   a constant-current source connected to said current supplying terminal for supplying a prescribed current such that said package is heated to a prescribed temperature in an isothermal vessel for screening said light emitting diode, and
   a control circuit for performing a temperature control of the isothermal vessel, a current control of said constant current source, and an application control of a constant-voltage to said voltage supplying terminal.

6. An optical transmitter comprising:
   a light-emitting diode;
   a drive circuit for outputting a light signal while driving said light-emitting diode which is connected between two electrodes of an anode and a cathode of said light-emitting diode;
   a voltage applying terminal for light-emitting diode which is arranged on a package on which said light-emitting diode and said drive circuit are mounted, for applying voltage to one electrode of said light-emitting diode;
   a current supplying terminal for screening said light-emitting diode arranged at said package for applying current at a time of screening of said light-emitting diode to the other electrode of said light-emitting diode; and a switch for turning ON/OFF electrically between said current supplying terminal for light-emitting diode and the other electrode of said light-emitting diode.

7. An optical transmitter as claimed in claim 6, wherein said current supplying terminal is arranged at a first surface part of said package at a substantially center portion so as not to protrude to a second surface part.

8. An optical transmitter as claimed in claim 6, wherein said one electrode is a cathode, while the other electrode is an anode.

9. An optical transmitter as claimed in claim 6, wherein a prescribed current is supplied from a constant current source to said current supplying terminal such that said package is heated to a prescribed temperature in an isothermal vessel.

10. An optical transmitter as claimed in claim 6, further comprising:

a constant-current source connected to said current supplying terminal for supplying a prescribed current such that said package is heated to prescribed temperature in an isothermal vessel for screening said light emitting diode, and a control circuit for performing a temperature control of the isothermal vessel, a current control of said constant current source, and an application control of a constant-voltage to said voltage applying terminal.

11. An optical transmitter comprising:

a light-emitting diode mounted on a package;

a voltage applying terminal for a light-emitting diode arranged on said package for applying voltage to one electrode of said light-emitting diode; and a current supplying terminal arranged at said package for screening said light-emitting diode, said current supplying terminal applying current at a time of screening of said light-emitting diode to another electrode of said light-emitting diode.

12. The optical transmitter as claimed in claim 11, further comprising:

a drive circuit arranged on said package for outputting a light signal while driving said light-emitting diode.

13. The optical transmitter as claimed in claim 12, wherein said drive circuit is connected between two electrodes of an anode and a cathode of said light-emitting diode.

14. The optical transmitter as claimed in claim 11, further comprising:

a switch for turning ON/OFF electrically between said current supplying terminal for light-emitting diode and the other electrode of said light-emitting diode.

15. The optical transmitter as claimed in claim 11, further comprising:

a constant-current source connected to said current supplying terminal for supplying a constant current such that said package is heated to a prescribed temperature.

16. The optical transmitter as claimed in claim 11, further comprising:

an isothermal vessel for holding said package.

17. The optical transmitter as claimed in claim 16, further comprising:

a control circuit for performing a temperature control of said isothermal vessel, a current control of said constant current source, and an application control of a constant-voltage to said voltage applying terminal.

18. A communication system comprising:

a mounting package placed within an isothermal vessel;

a light-emitting diode mounted on said mounting package;

a voltage applying terminal arranged on said mounting package for applying voltage to an electrode of said light-emitting diode; and a current supplying terminal arranged on said mounting package for screening said light-emitting diode, wherein said current supplying terminal applies a current to another electrode of said light-emitting diode at a time of screening said light-emitting diode.

19. The communication system as claimed in claim 18, further comprising:

a switch for turning ON/OFF electrically between said current supplying terminal for light-emitting diode and the other electrode of said light-emitting diode.

20. The communication system as claimed in claim 18, further comprising:

a control circuit connected to said isothermal vessel for performing a temperature control of said isothermal vessel.

* * * * *